(12) United States Patent
Zeng et al.

(10) Patent No.: US 9,299,460 B1
(45) Date of Patent: Mar. 29, 2016

(54) DATA STRUCTURE OF DEFECTIVE ADDRESS INFORMATION AND DEFECTIVE ADDRESS INFORMATION ENCODING METHOD FOR MEMORY ARRAY

(71) Applicant: LITE-ON TECHNOLOGY CORPORATION, Taipei (TW)

(72) Inventors: Shih-Jia Zeng, Taipei (TW); Jen-Chien Fu, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/690,859

(22) Filed: Apr. 20, 2015

Related U.S. Application Data

(60) Provisional application No. 62/061,184, filed on Oct. 8, 2014.

(51) Int. Cl.
  *G11C 16/06* (2006.01)
  *G11C 29/00* (2006.01)
  *G11C 16/08* (2006.01)

(52) U.S. Cl.
  CPC ............... *G11C 29/70* (2013.01); *G11C 16/08* (2013.01)

(58) Field of Classification Search
  CPC ........ G11C 29/70; G11C 29/02; G11C 29/04; G11C 29/42; G11C 29/76; G11C 29/789; G11C 16/08; G11C 16/04; G11C 11/0483
  USPC ................ 365/185.09, 200, 201, 230.03, 241
  See application file for complete search history.

(56) References Cited

U.S. PATENT DOCUMENTS

| 2006/0215454 A1* | 9/2006 | In ................ G11C 16/0483 365/185.17 |
| 2014/0198573 A1* | 7/2014 | Jung ................ G11C 16/24 365/185.12 |
| 2014/0237319 A1* | 8/2014 | Seo ................ G06F 11/1048 714/764 |

* cited by examiner

*Primary Examiner* — Tha-O H Bui
(74) *Attorney, Agent, or Firm* — WPAT, PC; Justin King

(57) ABSTRACT

A defective address information encoding method for a memory array is provided. A page of the memory array is divided into plural segments. Each segment contains $2^m$ bits. The defective address information encoding method includes the following steps. Firstly, positions of N1 fail bits in a first segment of the plural segments are acquired. Then, an (N1+1)-bit first segment start code is generated. Then, N1 m-bit defective codes are generated. The N1 m-bit defective codes follow the first segment start code to indicate the positions of the N1 fail bits in the first segment, wherein N1 is zero or a positive integer, and m is a positive integer.

14 Claims, 5 Drawing Sheets

| Fail bit number | 0 | 1 | 2 | 3 | ... | 32 | ... |
|---|---|---|---|---|---|---|---|
| Probability (%) | 52.26 | 33.98 | 10.81 | 2.65 | ... | $10^{-44}$ | ... |

| Fail bit number | Segment start code (Huffman code) |
|---|---|
| 0 | 0 |
| 1 | 10 |
| 2 | 110 |
| 3 | 1110 |
| 4 | 11110 |
| 5 | 111110 |
| ⋮ | ⋮ |

DATA STRUCTURE OF DEFECTIVE ADDRESS INFORMATION AND DEFECTIVE ADDRESS INFORMATION ENCODING METHOD FOR MEMORY ARRAY

This application claims the benefit of U.S. Provisional Application No. 62/061,184, filed Oct. 8, 2014, the subject matter of which is incorporated herein by reference.

FIELD OF THE INVENTION

The present invention relates to a defective address encoding method for a memory array, and more particularly to a data structure of a defective address information and a defective address information encoding method for a memory array.

BACKGROUND OF THE INVENTION

As is well known, a solid state drive (SSD) is a data storage device that uses a NAND-based flash memory to store data. The NAND-based flash memory is a non-volatile memory. After data are written to the flash memory, if no power is supplied to the flash memory, the data are still retained in the flash memory. Generally, the flash memory comprises plural memory arrays. Each memory array is divided into plural blocks as erase units. Moreover, each block is divided into plural pages as read/write units.

Generally, during the process of fabricating the flash memory, some defective cells are possibly generated. After the flash memory is fabricated, it is necessary to verify all cells of the memory array in order to realize all defective cells. Moreover, the addresses of the defective cells are stored in a defective address list. During the operations of the flash memory, the defective cells corresponding to all addresses listed in the defective address list are skipped and not used. Moreover, the detective cells may also be referred as fail bits.

In the memory array of the NAND-based flash memory, a 17,664-byte page has 141,312 bits (=17,664×8). The bit number 141,312 is greater than $2^{17}$ and smaller than $2^{18}$. Consequently, it needs a length of 18 bits for indicating the position of one bit in one page. That is, each position of the fail bits in one page can be recorded as an 18-bit defective address.

Generally, after the NAND-based flash memory is fabricated, the failure rate is about 1%. That is, there are about 1,414 (=14,132×1%) fail bits in one page. Consequently, in the defective address list, at least 25,452 (=1,414×18) bits are required to record the positions of the fail bits of one page.

As mentioned above, the defective address list occupies the storage space of the flash memory. For maintaining sufficient space to store data, the solid state drive should have an additional storage space to store the defective address list. Under this circumstance, the cost of the solid state drive increases.

Therefore, it is an important issue to reduce the data size of the defective address list.

SUMMARY OF THE INVENTION

An object of the present invention provides a defective address information encoding method for a memory array. The defective address information is encoded according to the Huffman encoding algorithm. In comparison with the conventional technology, if the number of fail bits is identical, the defective address information encoding method of the present invention can effectively reduce the data size of recording the positions of all fail bits.

A first embodiment of the present invention provides a data structure of a defective address information in a memory array. A page of the memory array is divided into plural segments. Each segment contains $2^m$ bits. The data structure of the defective address information includes plural segment codes corresponding to the plural segments. A first segment code of the plural segment codes is assigned to a first segment. The first segment contains N fail bits. The first segment code includes a first segment start code and N m-bit defective codes. The first segment start code has (N+1) bits to indicate a fail bit number of the first segment. The N m-bit defective codes follow the first segment start code to indicate positions of the N fail bits in the first segment. In this embodiment, N is zero or a positive integer, and m is a positive integer.

A second embodiment of the present invention provides a defective address information encoding method for a memory array. A page of the memory array is divided into plural segments. Each segment contains $2^m$ bits. The defective address information encoding method includes the following steps. Firstly, positions of N1 fail bits in a first segment of the plural segments are acquired. Then, an (N1+1)-bit first segment start code is generated. Then, N1 m-bit defective codes are generated. The N1 m-bit defective codes follow the first segment start code to indicate the positions of the N1 fail bits in the first segment, wherein N1 is zero or a positive integer, and m is a positive integer.

A third embodiment of the present invention provides a data structure of a defective address information in a memory array. A page of the memory array is divided into plural segments. Each segment contains $2^m$ bits. Each segment is divided into a first sub-segment and a second sub-segment. The data structure of the defective address information includes plural segment codes corresponding to the plural segments. A first segment code of the plural segment codes is assigned to a first segment. The first segment contains (Na+Nb) fail bits, wherein Na is a fail bit number of the first sub-segment of the first segment, and Nb is a fail bit number of the second sub-segment of the first segment. The first segment code includes a first segment start code, a first sub-segment fail bit code and Na (m−1)-bit defective codes and Nb (m−1)-bit defective codes. The first segment start code has (Na+Nb+1) bits. The first sub-segment fail bit code is a binary code of Na, wherein the first sub-segment fail bit code follows the first segment start code. The Na (m−1)-bit defective codes and Nb (m−1)-bit defective codes follow the first sub-segment fail bit code to indicate positions of the Na fail bits in the first sub-segment of the first segment and positions of the Nb fail bits in the second sub-segment of the first segment, wherein Na and Nb are zero or positive integers, and m is a positive integer.

A fourth embodiment of the present invention provides a defective address information encoding method for a memory array. A page of the memory array is divided into plural segments. Each segment contains $2^m$ bits. Each segment is divided into a first sub-segment and a second sub-segment. The defective address information encoding method includes the following steps. Firstly, positions of (Na1+Nb1) fail bits in a first segment of the plural segments are acquired, wherein Na1 is a fail bit number of the first sub-segment of the first segment, and Nb1 is a fail bit number of the second sub-segment of the first segment. Then, an (Na1+Nb1+1)-bit first segment start code is generated. Then, a first sub-segment fail bit code is generated. The first sub-segment fail bit code is a binary code of Na1, wherein the first sub-segment fail bit code follows the first segment start code. Then, Na1 (m−1)-bit defective codes and Nb1 (m−1)-bit defective codes are generated. The Na1 (m−1)-bit defective codes and the Nb1

(m−1)-bit defective codes follow the first sub-segment fail bit code to indicate positions of the Na1 fail bits in the first sub-segment of the first segment and positions of the Nb1 fail bits in the second sub-segment of the first segment, wherein Na1 and Nb1 are zero or positive integers, and m is a positive integer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a data structure of a defective address information. In a memory array, the storage space of one page is further divided into plural segments, and the addresses of all fail bits in each segment are recorded individually. In particular, each segment has a corresponding segment code to indicate the addresses of the fail bits of the segment. In an embodiment, each segment code contains a segment start code for indicating the fail bit number in the corresponding segment. Moreover, the segment start code is correlated with the probability of the corresponding fail bit number happened in one segment.

Figures 1A, 1B, 2:
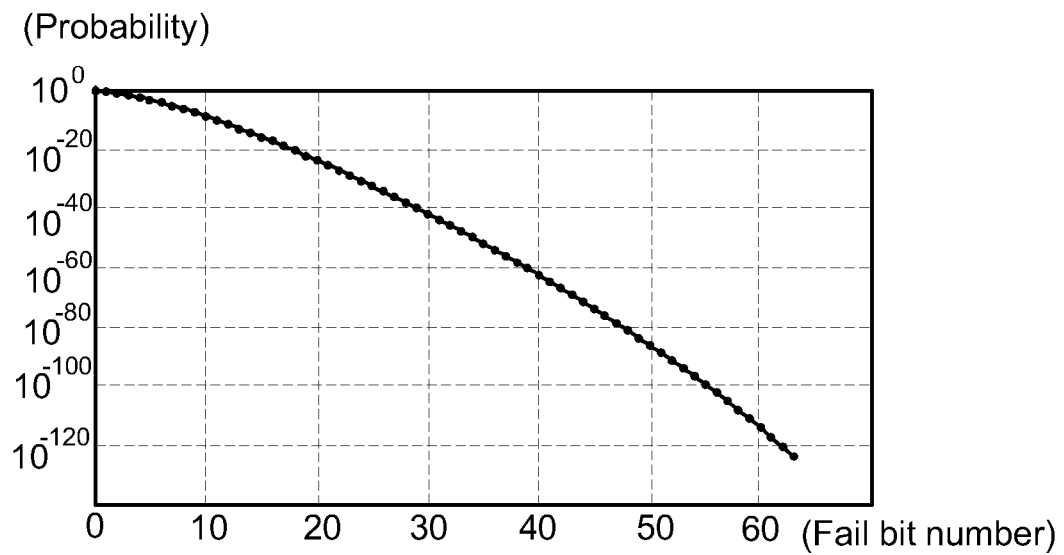
FIG. 1A is a plot illustrating the relationship between the fail bit number of a segment and the probability.
FIG. 1B is a table illustrating the relationship between the fail bit number of a segment and the probability.
FIG. 2 is a table illustrating the relationship between the segment start code and the fail bit number according to an embodiment of the present invention.

FIG. 1A is a plot illustrating the relationship between the fail bit number of a segment and the probability. FIG. 1B is a table illustrating the relationship between the fail bit number of a segment and the probability. In this embodiment, one page is divided into plural segments, wherein each segment contains 64 bits.

According to the statistics results, the probability corresponding to the increasing number of fail bits gradually decreases. For example, the probability corresponding to zero fail bit in one segment is the highest (e.g., about 52.26%); the probability corresponding to one fail bit in one segment is the second highest (e.g., about 33.98%); the probability corresponding to two fail bits in one segment is the third highest (e.g., about 10.81%); and the probability corresponding to three fail bits in one segment is the fourth highest (e.g., about 2.65%). Moreover, the probability corresponding to 32 fail bits in one segment is reduced to $10^{-44}$%.

As known, Huffman encoding algorithm is based on the probability. The event with the higher probability is represented by fewer bits, and the event with the lower probability is represented by more bits. FIG. 2 is a table illustrating the relationship between the segment start code and the fail bit number according to an embodiment of the present invention. In accordance with the present invention, the segment start code is determined according to the probability of the fail bit number happened in one segment. In particular, the segment start code can indicate the number of fail bits in the segment.

In case that the fail bit number in the segment is zero, the segment start code is "0". In case that the fail bit number in the segment is one, the segment start code is "10". In case that the fail bit number in the segment is two, the segment start code is "110". In case that the fail bit number in the segment is three, the segment start code is "1110". In case that the fail bit number in the segment is four, the segment start code is "11110". In case that the fail bit number in the segment is five, the segment start code is "111110". The rest may be deduced by analogy. That is, the total number of "1" in the segment start code is equal to the fail bit number in the segment. Moreover, the bit number of segment start code is determined according to the fail bit number. In particular, the bit number of segment start code is equal to the sum of the fail bit number and 1.

It is noted that numerous modifications and alterations may be made while retaining the teachings of the invention. For example, in another embodiment, the digits "0" and "1" may be exchanged. In case that the fail bit number in the segment is zero, the segment start code is "1". In case that the fail bit number in the segment is one, the segment start code is "01". In case that the fail bit number in the segment is two, the segment start code is "001". In case that the fail bit number in the segment is three, the segment start code is "0001". In case that the fail bit number in the segment is four, the segment start code is "00001". In case that the fail bit number in the segment is five, the segment start code is "000001". The rest may be deduced by analogy. That is, the total number of "0" in the segment start code is equal to the fail bit number in the segment.

Figure 3:
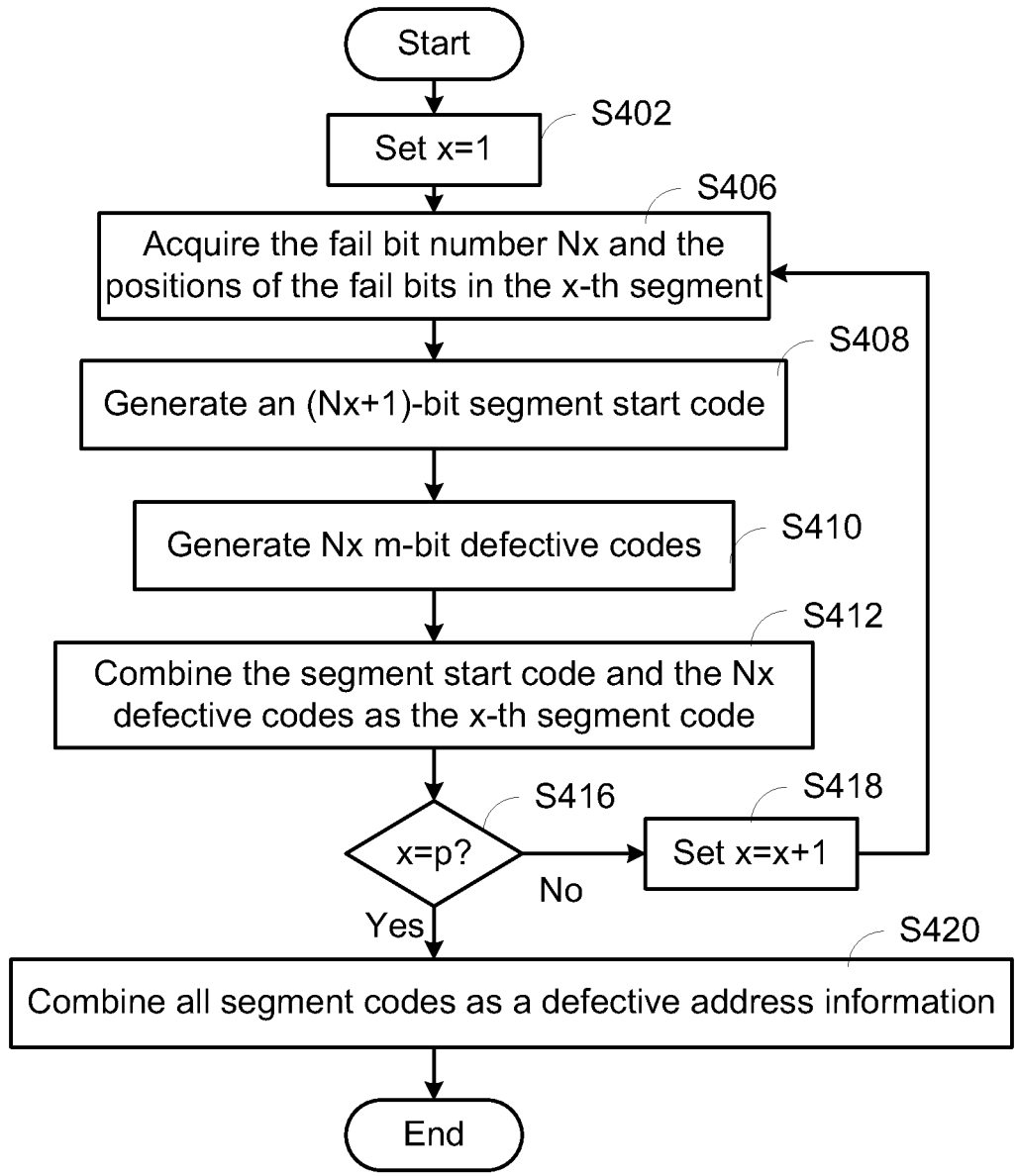
FIG. 3 is a flowchart illustrating a defective address information encoding method according to a first embodiment of the present invention.

FIG. 3 is a flowchart illustrating a defective address information encoding method according to a first embodiment of the present invention. In this embodiment, one page of the memory array is divided into p segments, wherein each segment contains $2^m$ bits. Consequently, the position of any fail bit in the segment can be indicated by m bits. Moreover, each segment has a corresponding segment code, and each segment code contains a segment start code. The segment start code indicates the fail bit number of the corresponding segment. Moreover, each segment code further contains a defective code if the fail bit number of the corresponding segment is not zero. The defective code indicates the position of the fail bit in the corresponding segment. In one case, if the fail bit number of the segment is zero, the corresponding segment code contains the segment start code without the defective code. Moreover, the data structure of the defective address information is the combination of all segment codes.

Firstly, set x=1 (Step S402). Then, the fail bit number Nx and the positions of the fail bits in the x-th segment are acquired (Step S406). The fail bit number Nx may be zero. Then, an (Nx+1)-bit segment start code is generated (Step S408), and Nx m-bit defective codes are generated (Step S410). Then, the segment start code and the Nx defective codes are combined as the x-th segment code (Step S412).

Then, the step S416 is performed to judge whether x is equal to p. If x is equal to p, it means that all of the p segment codes are acquired. Consequently, all segment codes are combined as a defective address information (Step S420). Whereas, if x is not equal to p in the step S416, it means that the p segment codes are not completely acquired. Then, set x=x+1 (Step S418). In addition, the step S406 is repeatedly done.

Figure 4:
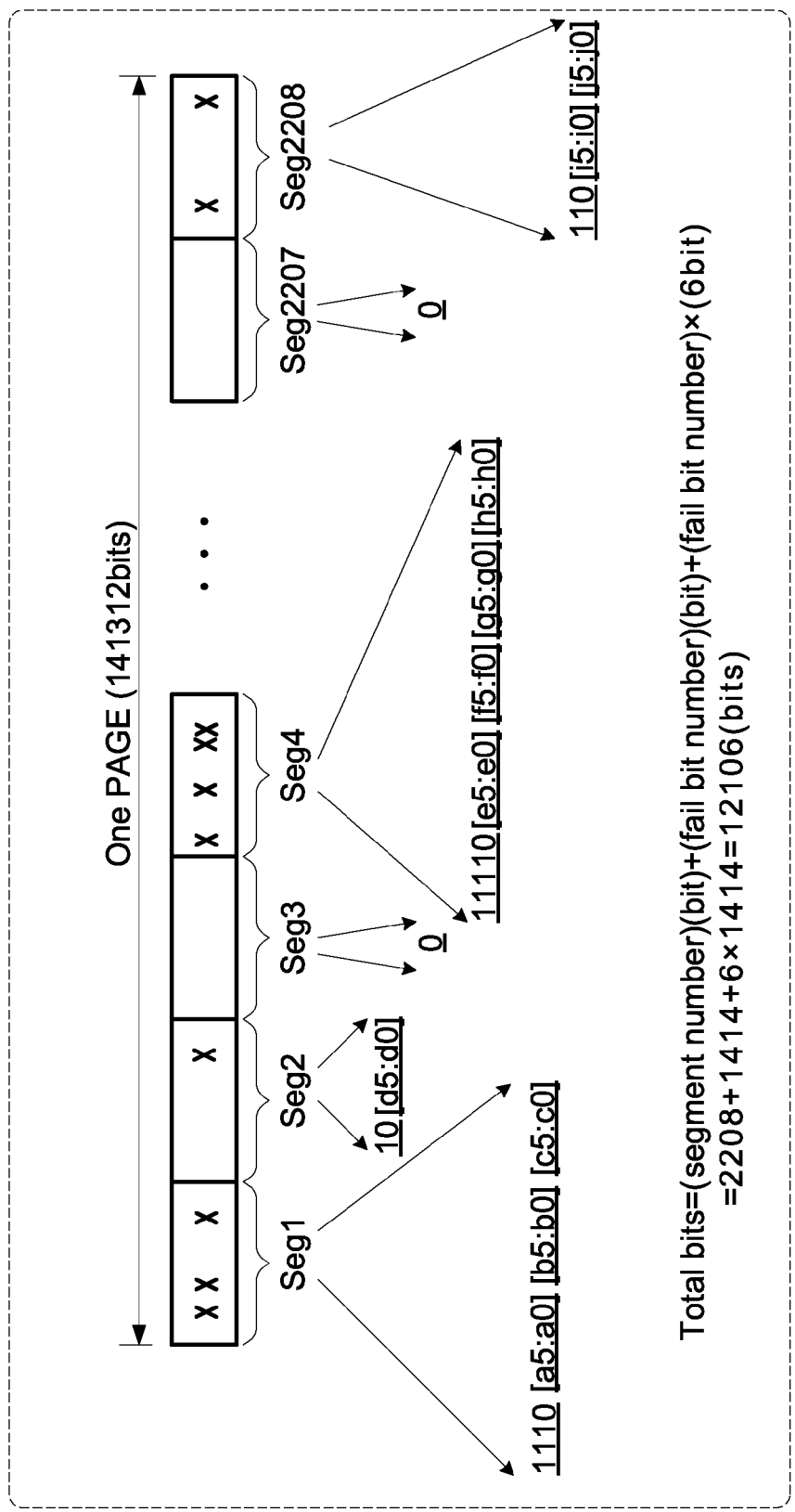
FIG. 4 schematically illustrates the data structure of a defective address information obtained by the defective address information encoding method according to the first embodiment of the present invention.

FIG. 4 schematically illustrates the data structure of a defective address information obtained by the defective address information encoding method according to the first embodiment of the present invention. In this embodiment, the storage space of one page is divided into plural segments. For example, if the storage space of one page is 141,312 bits and one segment contains 64 (=$2^6$) bits, one page is divided into 2,208 (=141,312/64) segments. Consequently, the position of any fail bit in the segment can be indicated by 6 bits.

In each segment code, the segment start code is determined according to the fail bit number. Next, a 6-bit defective code is used to indicate the position of the fail bit in the corresponding segment. For example, if the fail bit number of one segment is M, the segment start code is followed by M defective codes, wherein M is zero or a positive integer.

As shown in FIG. 4, the first segment Seg1 has three fail bits. Consequently, the first segment code is the combination of the segment start code "1110" and three subsequent defective codes, i.e., "1110 [a5:a0] [b5:b0] [c5:c0]". In the first segment code, [a5:a0] indicates the position of the first fail bit in the first segment Seg1, [b5:b0] indicates the position of the second fail bit in the first segment Seg1, and [c5:c0] indicates the position of the third fail bit in the first segment Seg1.

The second segment Seg2 has one fail bit. Consequently, the second segment code is the combination of the segment start code "10" and one subsequent defective code, i.e., "10 [d5:d0]". In the second segment code, [d5:d0] indicates the position of the first fail bit in the second segment Seg2.

The third segment Seg3 has zero fail bit. Consequently, the third segment code is the combination of the segment start code "0" and zero subsequent defective code, i.e., "0". In this case, the third segment code contains the segment start code without the defective code.

The fourth segment Seg4 has four fail bits. Consequently, the fourth segment code is the combination of the segment start code "11110" and four subsequent defective codes, i.e., "11110 [e5:e0] [f5:f0] [g5:g0] [h5:h0]". In the fourth segment code, [e5:e0] indicates the position of the first fail bit in the fourth segment Seg4, [f5:f0] indicates the position of the second fail bit in the fourth segment Seg4, [g5:g0] indicates the position of the third fail bit in the fourth segment Seg4, and [h5:h0] indicates the position of the fourth fail bit in the fourth segment Seg4.

The above approach is continuously performed to encode the remaining segment codes. Since the 2207-th segment Seg2207 has zero fail bit, the 2207-th segment code is the combination of the segment start code "0" and zero subsequent defective code, i.e., "0".

The 2208-th segment Seg2208 has two fail bits. Consequently, the 2208-th segment code is the combination of the segment start code "110" and two subsequent defective codes, i.e., "110 [i5:i0] [j5:j0]". In the 2208-th segment code, [i5:i0] indicates the position of the first fail bit in the 2208-th segment Seg2208, and [j5:j0] indicates the position of the second fail bit in the 2208-th segment Seg2208.

After all of the 2,208 segment codes are combined together, the defective address information of one page is encoded. The encoded defective address information of the page of the embodiment shown in FIG. 4 is "1110[a5:a0][b5:b0][c5:c0] 1 0[d5:d0]011110[e5:e0][f5:f0][g5:g0][h5:h0] ... 0110[i5:i0][j5:j0]".

Generally, after the NAND-based flash memory is fabricated, the failure rate is about 1%. That is, there are about 1,414 (=14,132×1%) fail bits in one page. Consequently, the bit length of the defective address information of one page is equal to 12,106 (=2,208+1,414+6×1,414) bits. The defective address information of one page records the positions of all fail bits of one page.

In comparison with the conventional technology, if the number of fail bits is identical, the defective address information encoding method of the present invention can effectively reduce the data size of recording the positions of all fail bits.

Figure 5:
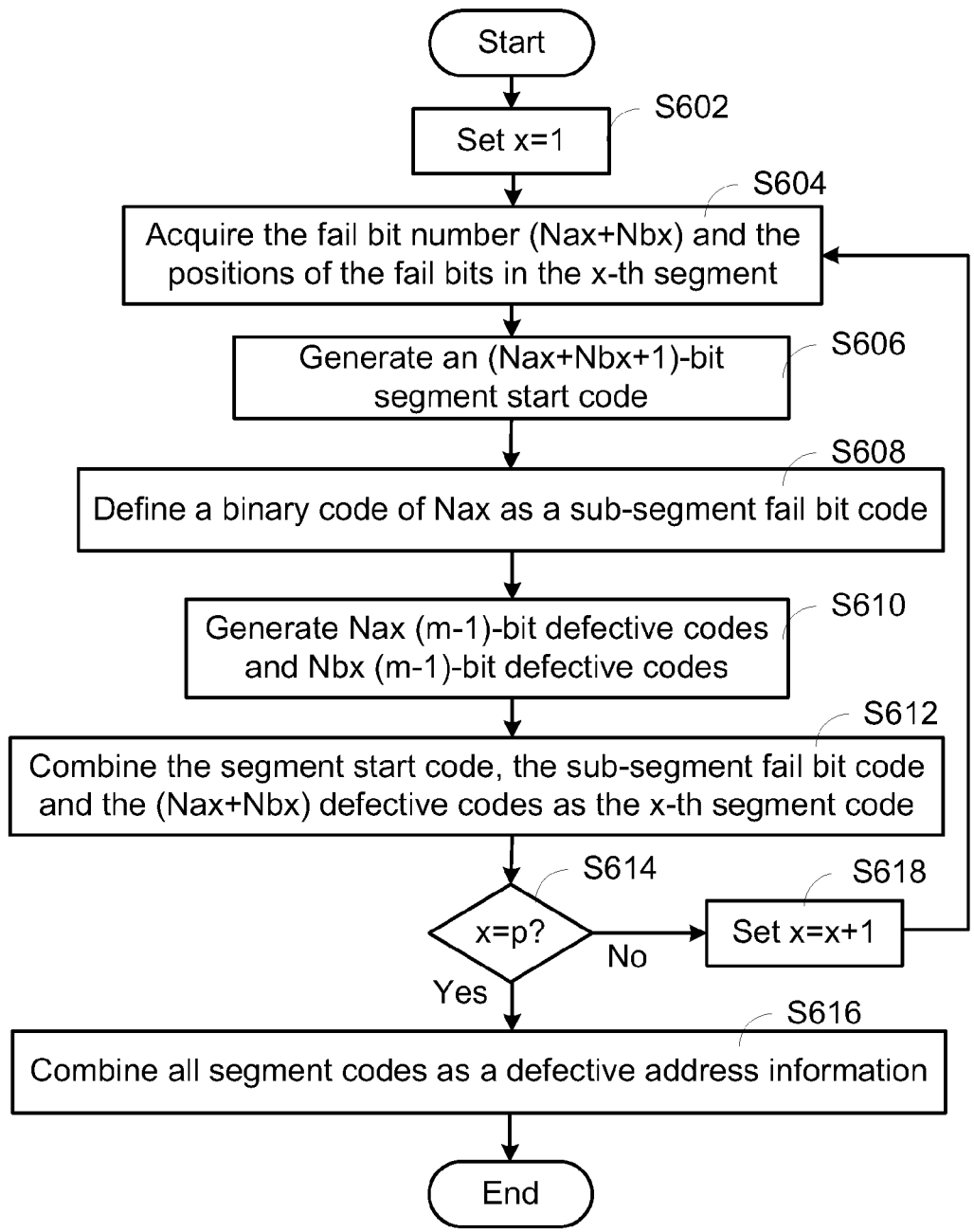
FIG. 5 is a flowchart illustrating a defective address information encoding method according to a second embodiment of the present invention.

FIG. 5 is a flowchart illustrating a defective address information encoding method according to a second embodiment of the present invention. In this embodiment, one page of the memory array is divided into p segments, wherein each segment contains $2^m$ bits. Moreover, each segment is divided into two sub-segments. Consequently, the position of any fail bit in the sub-segment can be indicated by (m−1) bits. Moreover, each segment has a corresponding segment code, and each segment code contains a segment start code. The segment start code indicates the fail bit number of the corresponding segment. Moreover, each segment code further contains a sub-segment fail bit code and a defective code if the fail bit number of the corresponding segment is not zero. The sub-segment fail bit code indicates the fail bit number of one sub-segment of the corresponding segment. The defective code indicates the position of the fail bit in the corresponding segment. In one case, if the fail bit number of the segment is zero, the corresponding segment code contains the segment start code without the sub-segment fail bit code and the defective code. Moreover, the data structure of the defective address information is the combination of all segment codes.

Firstly, set x=1 (Step S602). Then, the fail bit number (Nax+Nbx) and the positions of the fail bits in the x-th segment are acquired (Step S604). In the fail bit number (Nax+Nbx), Nax and Nbx indicate the fail bit numbers of the first sub-segment and the second sub-segment of the x-th segment, respectively, wherein Nax and Nbx may be zero. Then, an (Nax+Nbx+1)-bit segment start code is generated (Step S606), and a binary code of the number Nax is defined as a sub-segment fail bit code (Step S608). Then, Nax (m−1)-bit defective codes and Nbx (m−1)-bit defective codes are generated (Step S610). Then, the segment start code, the sub-segment fail bit code and the (Nax+Nbx) defective codes are combined as the x-th segment code (Step S612).

Then, the step S614 is performed to judge whether x is equal to p. If x is equal to p, it means that all of the p segment codes are acquired. Consequently, all segment codes are combined as a defective address information (Step S616). Whereas, if x is not equal to p in the step S614, it means that the p segment codes are not completely acquired. Then, set x=x+1 (Step S618). In addition, the step S604 is repeatedly done.

Figures 6, 7:
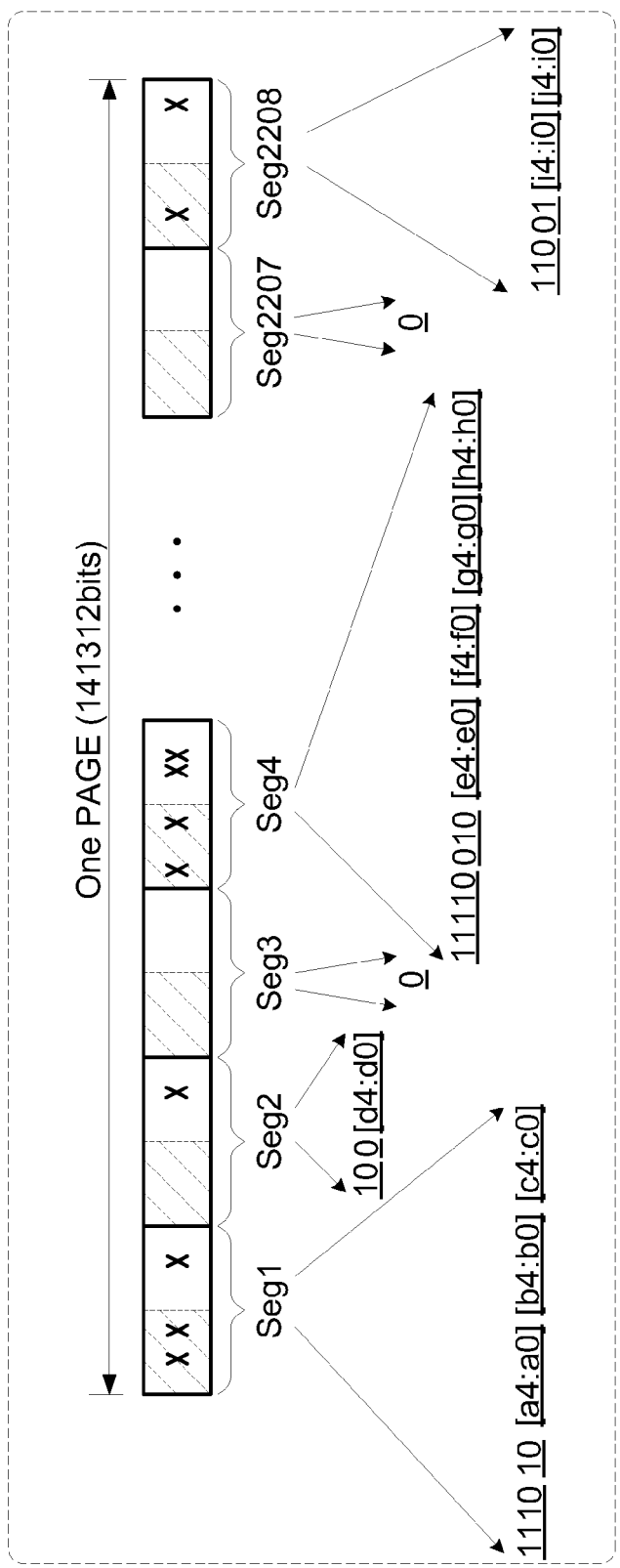
FIG. 6 schematically illustrates the data structure of a defective address information obtained by the defective address information encoding method according to the second embodiment of the present invention.
FIG. 7 is a table illustrating the relationship between the fail bit number of the segment, the bit length of the sub-segment fail bit code and the reduced bit number of the segment code according to the defective address information encoding method of the second embodiment.

FIG. 7 is a table illustrating the relationship between the fail bit number of the segment and the bit length of the sub-segment fail bit code by the defective address information encoding method according to the second embodiment of the present invention. In this embodiment, the sub-segment fail bit code may indicate the fail bit number Nax of the first sub-segment or the fail bit number Nbx of the second sub-segment of one segment. The bit length of the sub-segment fail bit code is determined according to the fail bit number (Nax+Nbx) of the segment and indicated by a binary code. For example, if the x-th segment has one fail bit (i.e., Nax+Nbx=1), the fail bit number of the first sub-segment or the second sub-segment has two possible values, i.e., "0" or "1". Under this circumstance, the length of sub-segment fail bit code is equal to one bit. Consequently, the fail bit number of the first sub-segment or the second sub-segment is indicated by a one-bit binary code. For example, the sub-segment fail bit code "0" indicates that the fail bit number is 0; and the sub-segment fail bit code "1" indicates that the fail bit number is 1.

Similarly, if the x-th segment has two fail bits (i.e., Nax+Nbx=2), the fail bit number of the first sub-segment or the second sub-segment has three possible values, i.e., "0", "1" or "2". Under this circumstance, the length of sub-segment fail bit code is equal to two bits. Consequently, the fail bit number of the first sub-segment or the second sub-segment is indicated by a two-bit binary code. For example, the sub-segment fail bit code "00" indicates that the fail bit number is 0; the sub-segment fail bit code "01" indicates that the fail bit number is 1; and the sub-segment fail bit code "10" indicates that the fail bit number is 2. Similarly, if the x-th segment has three fail bits (i.e., Nax+Nbx=3), the fail bit number of the first sub-segment or the second sub-segment has four possible values, i.e., "0", "1", "2" or "3". Under this circumstance, the length of sub-segment fail bit code is equal to two bits. Consequently, the fail bit number of the first sub-segment or the second sub-segment is indicated by a two-bit binary code. For example, the sub-segment fail bit code "00" indicates that the fail bit number is 0; the sub-segment fail bit code "01" indicates that the fail bit number is 1; the sub-segment fail bit code "10" indicates that the fail bit number is 2; and the sub-segment fail bit code "11" indicates that the fail bit number is 3. The rest may be deduced by analogy.

FIG. 6 schematically illustrates the data structure of a defective address information obtained by the defective address information encoding method according to the second embodiment of the present invention. In this embodiment, the storage space of one page is divided into plural segments.

For example, if the storage space of one page is 141,312 bits and one segment contains 64 (=$2^6$) bits, one page is divided into 2,208 (=141,312/64) segments. Moreover, each segment is divided into two sub-segments. For example, each segment is divided into a 32-bit first sub-segment and a 32-bit second sub-segment. Consequently, the position of any fail bit in the two sub-segments of the segment can be indicated by 5 bits.

In each segment code, the segment start code and the sub-segment fail bit code are determined according to the fail bit number. Next, a 5-bit defective code is used to indicate the position of the fail bit in the two sub-segments. For example, if the fail bit number of one segment is M, the segment code contains M defective codes. The sub-segment fail bit code is a binary code representing the fail bit number of the first sub-segment or the fail bit number of the second sub-segment. For illustration, the sub-segment fail bit code will be illustrated by referring to the binary code corresponding to the fail bit number of the first sub-segment.

As shown in FIG. 6, the first segment Seg1 has three fail bits. The fail bit number of the first sub-segment is 2, and the fail bit number of the second sub-segment is 1. Since the first segment Seg1 has three fail bits, the length of sub-segment fail bit code is equal to two bits. Consequently, the fail bit number of the first sub-segment is indicated by a two-bit binary code. Consequently, the first segment code is the combination of the segment start code "1110", the sub-segment fail bit code "10" and three subsequent defective codes, i.e., "1110 10 [a4:a0] [b4:b0] [c4:c0]". The segment start code "1110" indicates that the first segment Seg1 contains three fail bits. The sub-segment fail bit code "10" is a binary code representing two fail bits in the first sub-segment. According to calculation, it is realized that the second sub-segment has one fail bit. In the subsequent defective codes, [a4:a0] indicates the position of the first fail bit in the first sub-segment of the first segment Seg1, [b4:b0] indicates the position of the second fail bit in the first sub-segment of the first segment Seg1, and [c4:c0] indicates the position of the first fail bit in the second sub-segment of the first segment Seg1.

The second segment Seg2 has one fail bit. The fail bit number of the first sub-segment is 0, and the fail bit number of the second sub-segment is 1. Since the second segment Seg2 has one fail bit, the length of sub-segment fail bit code is equal to one bit. Consequently, the fail bit number of the first sub-segment is indicated by a one-bit binary code. Consequently, the second segment code is the combination of the segment start code "10", the sub-segment fail bit code "0" and one subsequent defective code, i.e., "10 0 [d4:d0]". The segment start code "10" indicates that the second segment Seg2 contains one fail bit. The sub-segment fail bit code "0" is a binary code representing zero fail bit in the first sub-segment. According to calculation, it is realized that the second sub-segment has one fail bit. In the subsequent defective code, [d4:d0] indicates the position of the first fail bit in the second sub-segment of the second segment Seg2.

The third segment Seg3 has zero fail bit. Consequently, the third segment code only contains the segment start code "0", representing zero fail bit in the third segment Seg3.

The fourth segment Seg4 has four fail bits. The fail bit number of the first sub-segment is 2, and the fail bit number of the second sub-segment is 2. Since the fourth segment Seg4 has four fail bits, the length of sub-segment fail bit code is equal to three bits. Consequently, the fail bit number of the first sub-segment is indicated by a three-bit binary code. Consequently, the fourth segment code is the combination of the segment start code "11110", the sub-segment fail bit code "010" and four subsequent defective codes, i.e., "11110 010 [e4:e0] [f4:f0] [g4:g0] [h4:h0]". The segment start code "11110" indicates that the fourth segment Seg4 contains four fail bits. The sub-segment fail bit code "010" is a binary code representing two fail bits in the first sub-segment. According to calculation, it is realized that the second sub-segment has two fail bits. In the subsequent defective codes, [e4:e0] indicates the position of the first fail bit in the first sub-segment of the fourth segment Seg4, [f4:f0] indicates the position of the second fail bit in the first sub-segment of the fourth segment Seg4, [g4:g0] indicates the position of the first fail bit in the second sub-segment of the fourth segment Seg4, and [h4:h0] indicates the position of the second fail bit in the second sub-segment of the fourth segment Seg4.

The above approach is continuously performed to encode the remaining segment codes. Since the 2207-th segment Seg2207 has zero fail bit, the 2207-th segment code only contains the segment start code "0", representing zero fail bit in the 2207-th segment Seg2207.

The 2208-th segment Seg2208 has two fail bits. The fail bit number of the first sub-segment is 1, and the fail bit number of the second sub-segment is 1. Consequently, the 2208-th segment code is the combination of the segment start code "110", the sub-segment fail bit code "01" and two subsequent defective codes, i.e., "110 01 [i4:i0] [j4:j0]". The segment start code "110" indicates that the 2208-th segment Seg2208 contains two fail bits. The sub-segment fail bit code "10" is a binary code representing one fail bit in the first sub-segment. According to calculation, it is realized that the second sub-segment has one fail bit. In the subsequent defective codes, [i4:i0] indicates the position of the first fail bit in the first sub-segment of the 2208-th segment Seg2208, and [j4:j0] indicates the position of the first fail bit in the second sub-segment of the 2208-th segment Seg2208.

After all of the 2,208 segment codes are combined together, the defective address information of one page is encoded. The encoded defective address information of the page of the embodiment shown in FIG. 6 is "111010[a4:a0] [b4:b0][c4:c0] 100[d4:d0]011110010[e4:e0][f4:f0][g4:g0] [h4:h0] 011001[i4:i0][j4:j0]".

In this embodiment, each segment is divided into two sub-segments in order to further reduce the data size of recording the positions of the fail bits. Consequently, the bit length of the defective code is reduced, and the bit length of the overall defective address information is shortened. In comparison with the first embodiment (see FIG. 4), if the number of fail bits is identical, the defective address information encoding method of this embodiment (see FIG. 6) can further reduce the data size of recording the positions of the fail bits. For example, the bit length of the first segment code obtained by the second embodiment is 21, and the bit length of the first segment code obtained by the first embodiment is 22, wherein the reduced bit number of the first segment code of the second embodiment is 1. In comparison with the first embodiment, the bit length of the defective codes of the first segment code is decreased by 3, but the sub-segment fail bit code increases the bit length of 2, so that the reduced bit number is 1. Similarly, the bit length of the fourth segment code obtained by the second embodiment is 28, and the bit length of the fourth segment code obtained by the first embodiment is 29, wherein the reduced bit number of the fourth segment code of the second embodiment is 1. In comparison with the first embodiment, the bit length of the defective codes of the fourth segment code is decreased by 4, but the sub-segment fail bit code increases the bit length of 3, so that the reduced bit number is 1.

FIG. 7 is a table illustrating the relationship between the fail bit number of the segment, the bit length of the sub-segment fail bit code and the reduced bit number of the segment code according to the defective address information encoding method of the second embodiment. In case that the fail bit number is identical, the bit length of the segment code according to the second embodiment is identical to or less than the bit length of the segment code according to the first embodiment. For example, if the fail bit number of the segment is 1, the bit length of the sub-segment fail bit code is 1, so that the reduced bit number of the segment code is 0. If the fail bit number of the segment is 2, the bit length of the sub-segment fail bit code is 2, so that the reduced bit number of the segment code is 0. If the fail bit number of the segment is 3, the bit length of the sub-segment fail bit code is 2, so that the reduced bit number of the segment code is 1. If the fail bit number of the segment is larger than 3, the reduced bit number of the segment code is 1 or more. The statistics result indicates that the reduced bit number of the defective address information of one page obtained by the defective address information encoding method of the second embodiment is about 180 (i.e., about 1.5%) when compared with the first embodiment. That is, if the failure rate is about 1%, the bit length of the defective address information of one page by the defective address information encoding method of the second embodiment is about 11,926 bits.

In comparison with the conventional technology and the first embodiment of the present invention, if the number of fail bits is identical, the defective address information encoding method of the second embodiment can reduce the data size of recording the positions of the fail bits more effectively.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data structure of a defective address information in a memory array, a page of the memory array being divided into plural segments, each segment containing $2^m$ bits, the data structure of the defective address information comprising:
   plural segment codes corresponding to the plural segments, wherein a first segment code of the plural segment codes is assigned to a first segment, and the first segment contains N fail bits, wherein the first segment code comprises:
      a first segment start code having (N+1) bits to indicate a fail bit number of the first segment; and
      N m-bit defective codes following the first segment start code to indicate positions of the N fail bits in the first segment,
   wherein N is zero or a positive integer, and m is a positive integer.

2. The data structure of the defective address information as claimed in claim 1, wherein the first segment start code is determined according to a probability of the fail bit number happened in one segment.

3. The data structure of the defective address information as claimed in claim 1, wherein the first segment start code contains N first digits and one subsequent second digit, wherein the first digit and the second digit are different.

4. A defective address information encoding method for a memory array, a page of the memory array being divided into plural segments, each segment containing $2^m$ bits, the defective address information encoding method comprising steps of:
   acquiring positions of N1 fail bits in a first segment of the plural segments;
   generating an (N1+1)-bit first segment start code; and
   generating N1 m-bit defective codes, wherein the N1 m-bit defective codes follow the first segment start code to indicate the positions of the N1 fail bits in the first segment,
   wherein N1 is zero or a positive integer, and m is a positive integer.

5. The defective address information encoding method as claimed in claim 4, further comprising:
   acquiring positions of N2 fail bits in a second segment of the plural segments;
   generating an (N2+1)-bit second segment start code; and
   generating N2 m-bit defective codes, wherein the N2 m-bit defective codes follow the second segment start code to indicate the positions of the N2 fail bits in the second segment;
   wherein N2 is zero or a positive integer.

6. The defective address information encoding method as claimed in claim 5, wherein the first segment start code and the second segment start code are determined according to a probability of the fail bit number happened in one segment.

7. The defective address information encoding method as claimed in claim 5, wherein the first segment start code contains N1 first digits and one subsequent second digit, and the second segment start code contains N2 first digits and one subsequent second digit, wherein the first digit and the second digit are different.

8. A data structure of a defective address information in a memory array, a page of the memory array being divided into plural segments, each segment containing $2^m$ bits, each segment being divided into a first sub-segment and a second sub-segment, the data structure of the defective address information comprising:

plural segment codes corresponding to the plural segments, wherein a first segment code of the plural segment codes is assigned to a first segment, and the first segment contains (Na+Nb) fail bits, wherein Na is a fail bit number of the first sub-segment of the first segment, and Nb is a fail bit number of the second sub-segment of the first segment, wherein the first segment code comprises:
a first segment start code having (Na+Nb+1) bits;
a first sub-segment fail bit code, which is a binary code of Na,
wherein the first sub-segment fail bit code follows the first segment start code; and
Na (m−1)-bit defective codes and Nb (m−1)-bit defective codes following the first sub-segment fail bit code to indicate positions of the Na fail bits in the first sub-segment of the first segment and positions of the Nb fail bits in the second sub-segment of the first segment,
wherein Na and Nb are zero or positive integers, and m is a positive integer.

9. The data structure of the defective address information as claimed in claim 8, wherein the first segment start code is determined according to a probability of the fail bit number happened in one segment.

10. The data structure of the defective address information as claimed in claim 8, wherein the first segment start code contains (Na+Nb) first digits and one subsequent second digit, wherein the first digit and the second digit are different.

11. A defective address information encoding method for a memory array, a page of the memory array being divided into plural segments, each segment containing $2^m$ bits, each segment being divided into a first sub-segment and a second sub-segment, the defective address information encoding method comprising steps of:

acquiring positions of (Na1+Nb1) fail bits in a first segment of the plural segments, wherein Na1 is a fail bit number of the first sub-segment of the first segment, and Nb1 is a fail bit number of the second sub-segment of the first segment;
generating an (Na1+Nb1+1)-bit first segment start code;
generating a first sub-segment fail bit code, which is a binary code of Na1, wherein the first sub-segment fail bit code follows the first segment start code; and
generating Na1 (m−1)-bit defective codes and Nb1 (m−1)-bit defective codes following the first sub-segment fail bit code to indicate positions of the Na1 fail bits in the first sub-segment of the first segment and positions of the Nb1 fail bits in the second sub-segment of the first segment,
wherein Na1 and Nb1 are zero or positive integers, and m is a positive integer.

12. The defective address information encoding method as claimed in claim 11, further comprising:
acquiring positions of (Na2+Nb2) fail bits in a second segment of the plural segments, wherein Na2 is a fail bit number of the first sub-segment of the second segment, and Nb2 is a fail bit number of the second sub-segment of the second segment;
generating an (Na2+Nb2+1)-bit second segment start code;
generating a second sub-segment fail bit code, which is a binary code of Na2, wherein the second sub-segment fail bit code follows the second segment start code; and
generating Na2 (m−1)-bit defective codes and Nb2 (m−1)-bit defective codes following the second sub-segment fail bit code to indicate positions of the Na2 fail bits in the first sub-segment of the second segment and positions of the Nb2 fail bits in the second sub-segment of the second segment;
wherein Na2 and Nb2 are zero or positive integers, and m is a positive integer.

13. The defective address information encoding method as claimed in claim 12, wherein the first segment start code and the second segment start code are determined according to a probability of the fail bit number happened in one segment.

14. The defective address information encoding method as claimed in claim 12, wherein the first segment start code contains (Na1+Nb1) first digits and one subsequent second digit, and the second segment start code contains (Na2+Nb2) first digits and one subsequent second digit, wherein the first digit and the second digit are different.

* * * * *